United States Patent
Rahman

(10) Patent No.: US 7,656,695 B2
(45) Date of Patent: Feb. 2, 2010

(54) ELECTRONIC FUSE SYSTEM AND METHODS

(75) Inventor: Mohammad Jahidur Rahman, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 316 days.

(21) Appl. No.: 11/852,687

(22) Filed: Sep. 10, 2007

(65) Prior Publication Data

US 2009/0067211 A1    Mar. 12, 2009

(51) Int. Cl.
*G11C 17/00* (2006.01)
(52) U.S. Cl. .................................. 365/96; 365/225.7
(58) Field of Classification Search ............... 365/96, 365/225.7
See application file for complete search history.

(56) References Cited

U.S. PATENT DOCUMENTS

| | | | |
|---|---|---|---|
| 6,445,606 B1 * | 9/2002 | Khoury | 365/96 |
| 6,768,694 B2 | 7/2004 | Anand et al. | |
| 7,089,136 B2 | 8/2006 | Anand et al. | |
| 7,095,671 B2 * | 8/2006 | Krishnan et al. | 365/225.7 |
| 7,152,187 B2 | 12/2006 | Tran et al. | |
| 2004/0080357 A1 | 4/2004 | Chuang et al. | |
| 2006/0184799 A1 | 8/2006 | Seo et al. | |
| 2007/0280016 A1 * | 12/2007 | Bucksch | 365/201 |

OTHER PUBLICATIONS

PCT Notification of Transmittal of the International Search Report and the Written Opinion of the International Searching Authority, or the Declaration, and the Written Opinion of the International Searching Authority, dated Apr. 8, 2009, Authorized Officer Roh Choon Park.

* cited by examiner

*Primary Examiner*—Anh Phung
(74) *Attorney, Agent, or Firm*—William B. Kempler; Wade J. Brady III; Frederick J. Telecky, Jr.

(57) ABSTRACT

An electronic fuse system and method are disclosed employing a fuse ROM having one or more blocks of memory. Each block of memory comprises a plurality of words with at least one word of the plurality of words containing security bits associated with a respective block. An electronic fuse controller is in communication with the fuse ROM and one or more external devices that are configured to request one or more words that reside in the fuse ROM from the electronic fuse controller. At least one security register includes indication bits that provide an indication whether security bits have been obtained for a respective block of memory of the fuse ROM after a power down and power up cycle. The electronic fuse controller provides the requested word if an indication bit associated with the block of memory is set.

20 Claims, 5 Drawing Sheets

ELECTRONIC FUSE SYSTEM AND METHODS

TECHNICAL FIELD

This invention relates to electronics, and more specifically to an electronic fuse system and methods.

BACKGROUND

Conventional wireless devices, including personal electronic devices (PEDs) execute an autoload operation as part of the chip reset sequence to initialize the memory, device configurations, security keys, and other operations. The devices typically include a chip having a controller and a state machine located therein. The state machine reads data that includes, for example, repair and device information into the controller provided by the autoload operation. The data read into the controller is extracted from memory such as read only memory (ROM) or reprogrammable memory such as a fuse ROM circuit.

During the autoload operation, the controller sequentially reads words located in the ROM. Various chip components, for example read access memory (RAM) circuits will request information from the fuse ROM circuit. For protection, security bits are read by the controller from the ROM each time a request is made for information from the ROM. After obtaining the security information, the user information is read from the fuse ROM via a serial path to the requesting chip component.

When the controller is powered down, reset, or enters a sleep mode, the autoload information is lost in both the controller and in the requesting chip components. This may require upon powering-up reexecution of the autoload operation, which is highly time consuming and current memory intensive. For example, a length of 666 elements (longest length known to be used) at a clock speed of 33 MHz, the autoload operation would take approximately 22 milliseconds.

Accordingly, after a conventional device chip controller is powered-down, reset, or enters into a sleep mode, it becomes subject to lost time as a result of the need to reexecute the autoload program. Avoiding such problems by allowing the controller to remain active is power consuming, especially for wireless or mobile PEDs. Furthermore, it is time intensive to require the controller to request security information from the ROM each time information is requested by chip components. However, to allow the information to be sent to the requesting components without acquiring the security information produces potential security violations.

SUMMARY

One embodiment of the present invention includes an electronic fuse system comprising a fuse read only memory (ROM) having one or more blocks of memory. Each block of memory comprises a plurality of words with at least one word of the plurality of words containing security bits associated with a respective block. The system further comprises an electronic fuse controller in communication with the fuse ROM and one or more external devices that are configured to request one or more words that reside in the fuse ROM from the electronic fuse controller and at least one security register that includes indication bits that provide an indication whether security bits have been obtained for a respective block of memory of the fuse ROM after a power down and power up cycle. The electronic fuse controller, in response to a request to read a word from a block of memory from an external device, provides the requested word if an indication bit associated with the block of memory is set or reads the at least one word of the plurality of words containing security bits associated with the block of memory if the indication bit associated with the block of memory is not set, sets the indication bit associated with the block of memory, and provides the requested word.

Another embodiment of the present invention includes a method of transferring secured data from an electronic fuse system comprising providing a fuse read only memory (ROM) having one or more blocks of memory. Each block of memory comprises a plurality of words with at least one word of the plurality of words containing security bits associated with a respective block. The method further comprises communicating an electronic fuse controller with the fuse ROM and one or more external devices that are configured to request one or more words that reside in the fuse ROM from the electronic fuse controller. The method yet further comprises evaluating at least one security register that includes indication bits that provide an indication whether security bits have been obtained for a respective block of memory of the fuse ROM after a power down and power up cycle. The electronic fuse controller, in response to a request to read a word from a block of memory from an external device, provides the requested word if during the evaluation an indication bit associated with the block of memory is set or reads the at least one word of the plurality of words containing security bits associated with the block of memory if the indication bit associated with the block of memory is not set, sets the indication bit associated with the block of memory, and provides the requested word.

Yet another embodiment of the present invention includes an integrated circuit containing an electronic fuse system comprising a fuse read only memory (ROM) having one or more blocks of memory. Each block of memory comprises a plurality of words with at least one word of the plurality of words containing security bits associated with a respective block. The integrated circuit further comprises an electronic fuse controller in communication with the fuse ROM and one or more external devices that are configured to request one or more words that reside in the fuse ROM from the electronic fuse controller and at least one security register that includes indication bits that provide an indication whether security bits have been obtained for a respective block of memory of the fuse ROM after a power down and power up cycle. The electronic fuse controller, in response to a request to read a word from a block of memory from an external device, provides the requested word if an indication bit associated with the block of memory is set or reads the at least one word of the plurality of words containing security bits associated with the block of memory if the indication bit associated with the block of memory is not set, sets the indication bit associated with the block of memory, and provides the requested word.

DETAILED DESCRIPTION

This invention relates to electronic fuse system and methods for reducing power and processing time requirements while maintaining system security. In particular, the electronic fuse system and methods are designed to save power and processing time by retaining select information acquired by the controller during an autoload operation. In addition, processing time is reduced by eliminating additional security reads before transferring data to requesting devices, while maintaining security to the system.

Figure 1:
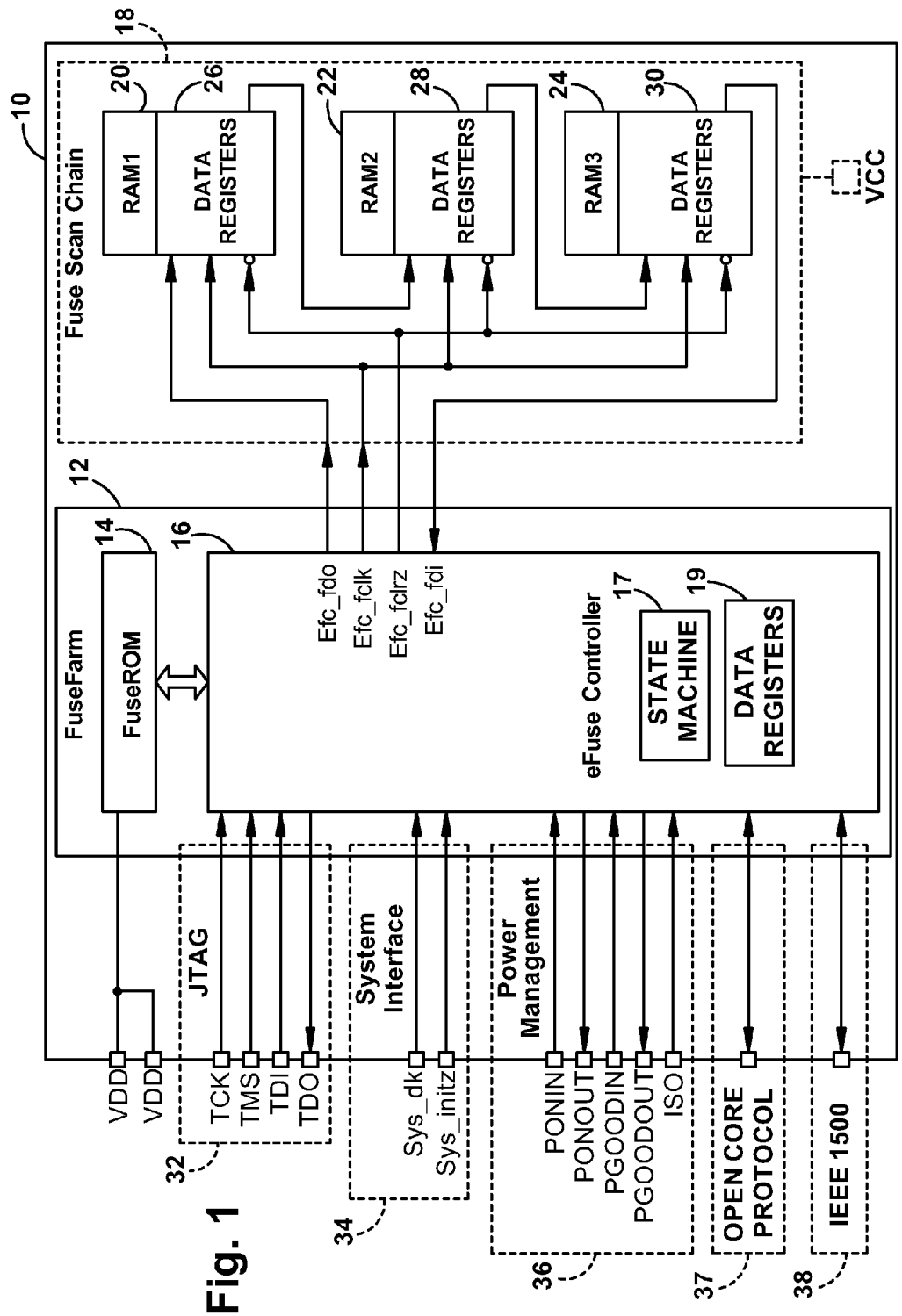
FIG. 1 illustrates a fuse farm controller circuit in accordance with an aspect of the invention.

Referring now to the figures and in particular to FIG. 1 is an electronic fuse system that resides on an integrated circuit 10. The integrated circuit 10 can be employed for use with wireless devices and mobile devices, including personal electronic devices (PEDs), cell phones, and the like. The electronic fuse system includes a fuse farm 12 comprising a ROM circuit and in particular a programmable fuse ROM 14 in communication with an efuse controller 16. Internal to the efuse controller 16 is a state machine 17 and power registers 19. The integrated circuit 10 further comprises a fuse scan chain 18. The fuse scan chain 18 provides information to a plurality of RAM memory devices 20, 22, and 24. The RAM memory devices 20, 22, and 24 each contain data registers 26, 28, and 30, respectively in communication with the fuse farm 12. The fuse farm 12 consolidates fuses for a chip into a single block, simplifying chip implementation. Power is supplied to the fuse farm 12 through different power domains VDD. The fuse scan chain 18 receives power from a separate power domain VCC.

Figure 2:
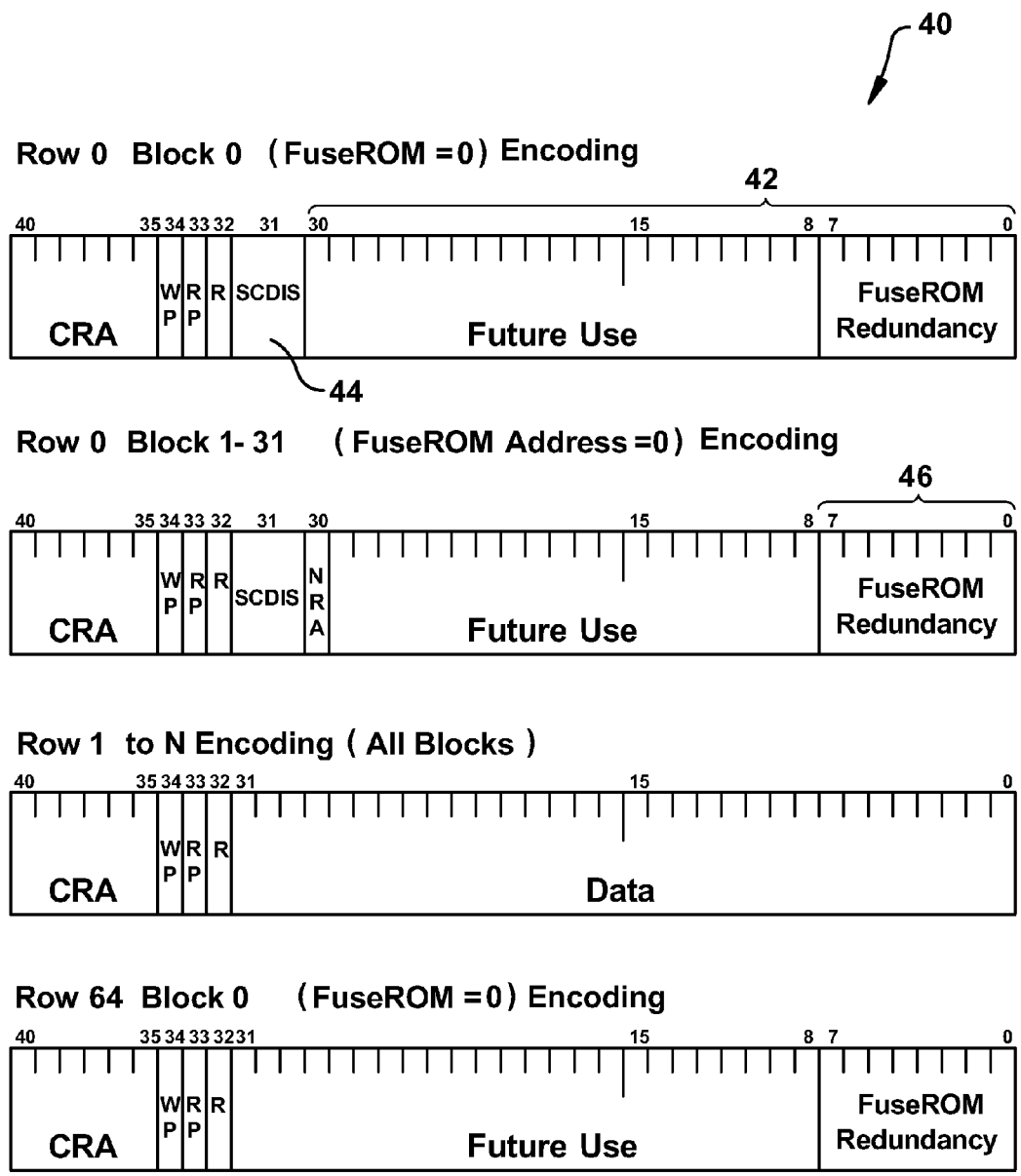
FIG. 2 illustrates a fuse ROM memory block in accordance with an aspect of the invention.

FIG. 1 further illustrates the basic fuse farm 12 structure and signals, including the joint test action group (JTAG) interface 32, system interfaces 34, power management 36 pin connections, open core protocol (OPC) interface 37, and an IEEE 1500 interface 38. Although only one fuse ROM 14 is illustrated, the fuse farm 12 can contain up to 32 different ROMs or fuse ROMs, each comprising an internal memory block. In the illustrated embodiment of FIG. 1, the fuse ROM 14 comprises a forty-one (41) bit by up to sixty-four (64) row array or memory block 40, as depicted in FIG. 2. Each row comprises a six column repair address (CRA) data bits [40:35], three reserved bits, write protect (WP) data bit [34], read protect (RP) data bit [33], and repair (R) data bit [32]. Data bits in [30:0] in row (1) one store general data 42 that could be source and/or destination operands of arithmetic or logic instructions, address, or repair information. A select number of bits of some arrays are reserved for fuse ROM redundancy 46. Any non-zero redundancy bits 46 are part of the general data bits 42 and provide an indication that a repair has been made to the fuse. A security data bit 44 or load fuse scan disable bit (SCDIS) data bit [31] is provided in row (0) zero, which supplies security information so that requested information from the scan chain 18 will be blocked absent authorization by the efuse controller 16, as will be discussed below in further detail. Data bit [30] in row (0) zero is used to indicate a new repair address (NRA) mode. The data sizes in the example embodiment are for illustrative purposes and could be any size without departing from the spirit and scope of the electronic fuse system.

Figure 3:
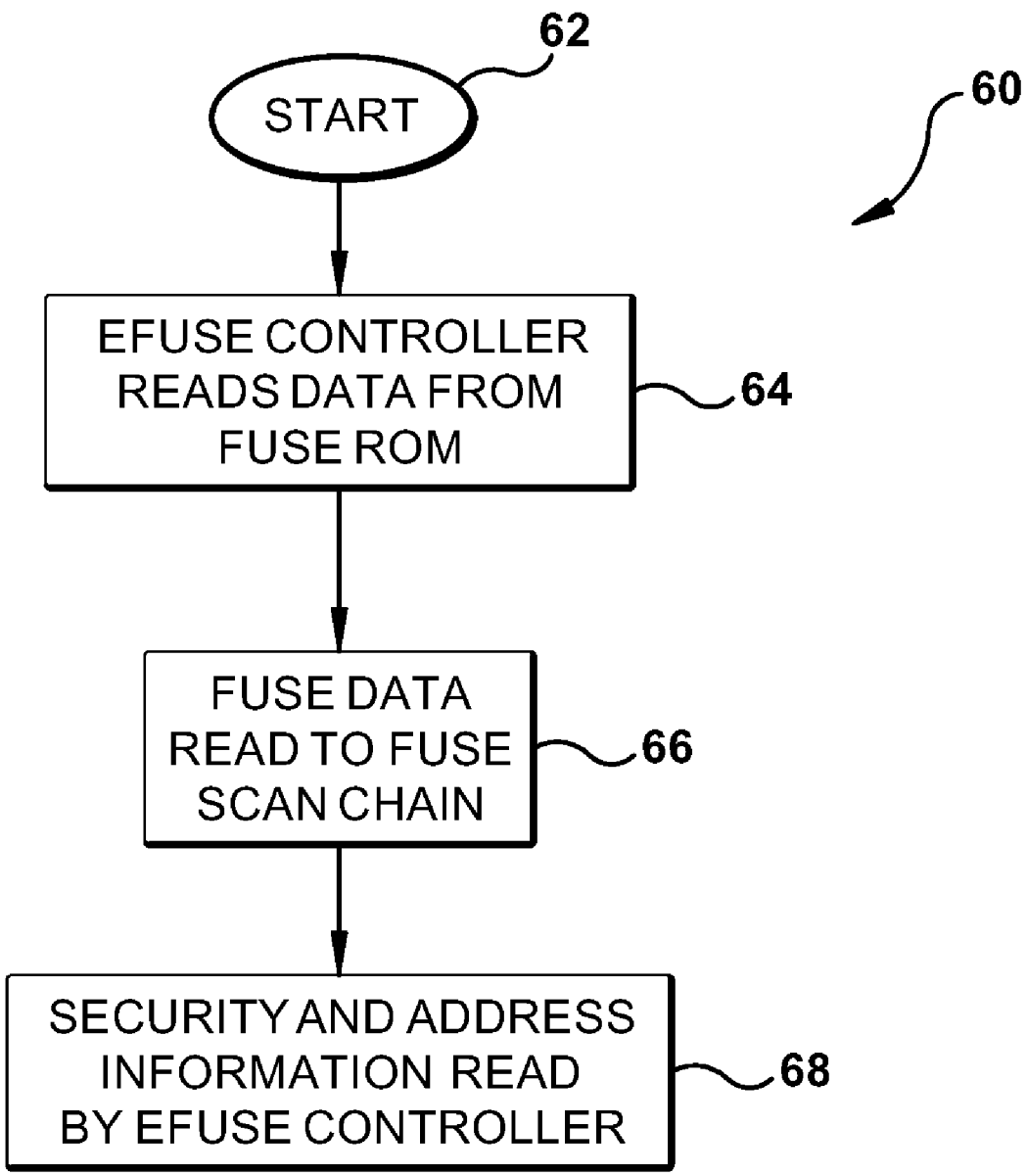
FIG. 3 illustrates an example of an autoload process in accordance with one aspect of the invention.

During startup or initialization of the integrated circuit 10 an autoload process 60 is executed as illustrated in FIG. 3. The autoload process 60 occurs as part of the chip reset sequence to initialize memory, device configurations, security keys, and the like. In the illustrated example of FIG. 3, the autoload process 60 is initiated at 62 after, for example, a system reset. At 64, the efuse controller reads fuse data from the fuse ROM and provides the information to the fuse scan chain via the state machine at 66. At 68, the efuse controller reads fuse ROM redundancy addresses and security information programmed in each ROM block located in the fuse ROM.

Depending on the security information 44, different bits are set in the efuse controller 16 power registers 19 so that the controller can respond to command requests coming from different memory devices accordingly, such as a tester through the JTAG interface 32 or a processor through the OCP interface 37. After the autoload process 60 is complete, an autoload done bit is also set in the efuse controller 16 power registers 19 to select the inputs for the different settings for the operation of the efuse controller. For example, prior to the autoload process 60, the width of the clocks to the fuse ROM 14 is selected using the input pins of the efuse controller 16, the width of the fuse ROM 14 clock is selected by the register setting after the autoload process is done.

When the fuse farm 12 is in a power-down mode, any information acquired during the autoload process 60 by the efuse controller 16, including security information is lost. However, as a result of the fuse scan chain 18 being on a separate power domain VCC, both power and the fuse data acquired during the autoload process 60 is maintained by the devices located in the fuse scan chain, such as the memory devices 20-24. This eliminates the need to reexecute the autoload process 60 each time the fuse farm 12 powers-down or enters a sleep mode, as the autoload process is both time consuming and dynamic power intensive.

During the power-down or sleep mode periods experienced by the fuse farm 12, if a tester through the JTAG interface or a processor through the OCP interface or one or more remote devices request information from a particular row or ROM in the fuse ROM 14, the requested information is denied until the security information 44 is acquired by the efuse controller 16. As a result, the system's security is maintained. In response to the requested information, the fuse farm 12 is instructed to power-up and the efuse controller 16 reads security information 44 bit or bits from row (0) zero of the requested ROM block 40. Once the requested security information 44 is obtained, the related pending requests for information are processed.

Figure 4:
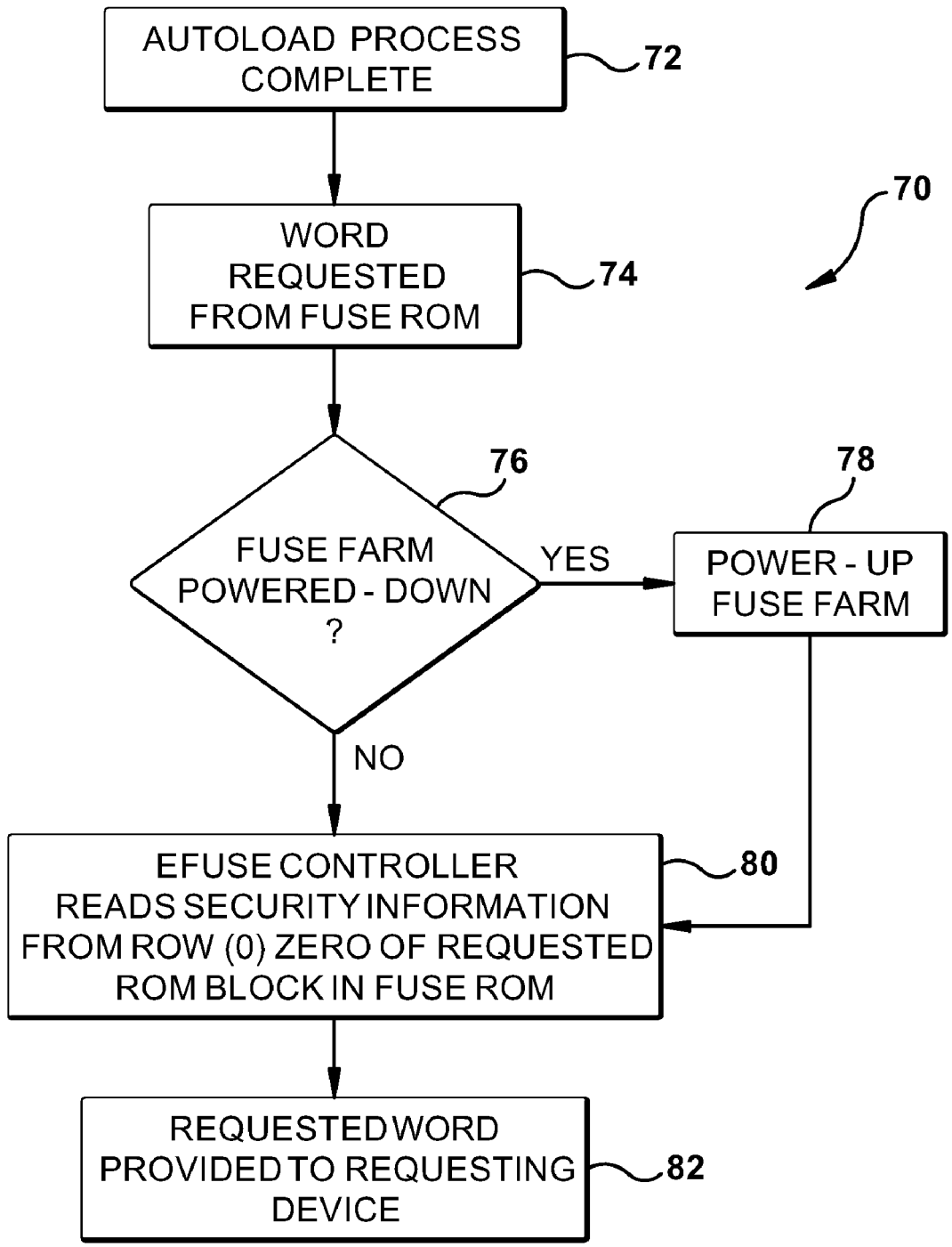
FIG. 4 illustrates an example of a security read process in accordance with one aspect of the invention.

This above operation is further illustrated in the security process 70 of FIG. 4. At 72, the autoload process of FIG. 3 has been completed. At 74, a request is made by a device for at least one word from the fuse ROM, such as from a memory device or one or more remote devices. At 76, a determination is made as to whether the fuse farm is powered down. If the determination is in the affirmative at step 76, the fuse farm is powered-up at 78 before performing process step 80. If the determination 76 is in the negative, the efuse controller at 80 reads the requested security information of row (0) zero of the requested ROM block of fuse ROM. At 82, the requested word or words are communicated to the requesting device.

In another example embodiment, the construct of the efuse controller 16 advantageously reduces processing time by eliminating additional reads from the fuse ROM 14 when obtaining already acquired security information. For example, once a device requests information from row 5 of ROM block 6, the efuse controller 16 reads the security information 44 bit or bits from row (0) zero of ROM block 6 before authorizing the read of the requested information. At the same time, the efuse controller sets a security read bit in the power register 19 high. Any subsequent request for information from ROM block 6, the security bit being high provides an indication that the reading of the security information 44 for ROM block 6 can be avoided, saving time and power. Upon power-down or the entry of sleep mode by the fuse farm 12, all security bits information in the efuse controller 16 are reset to low.

Figure 5:
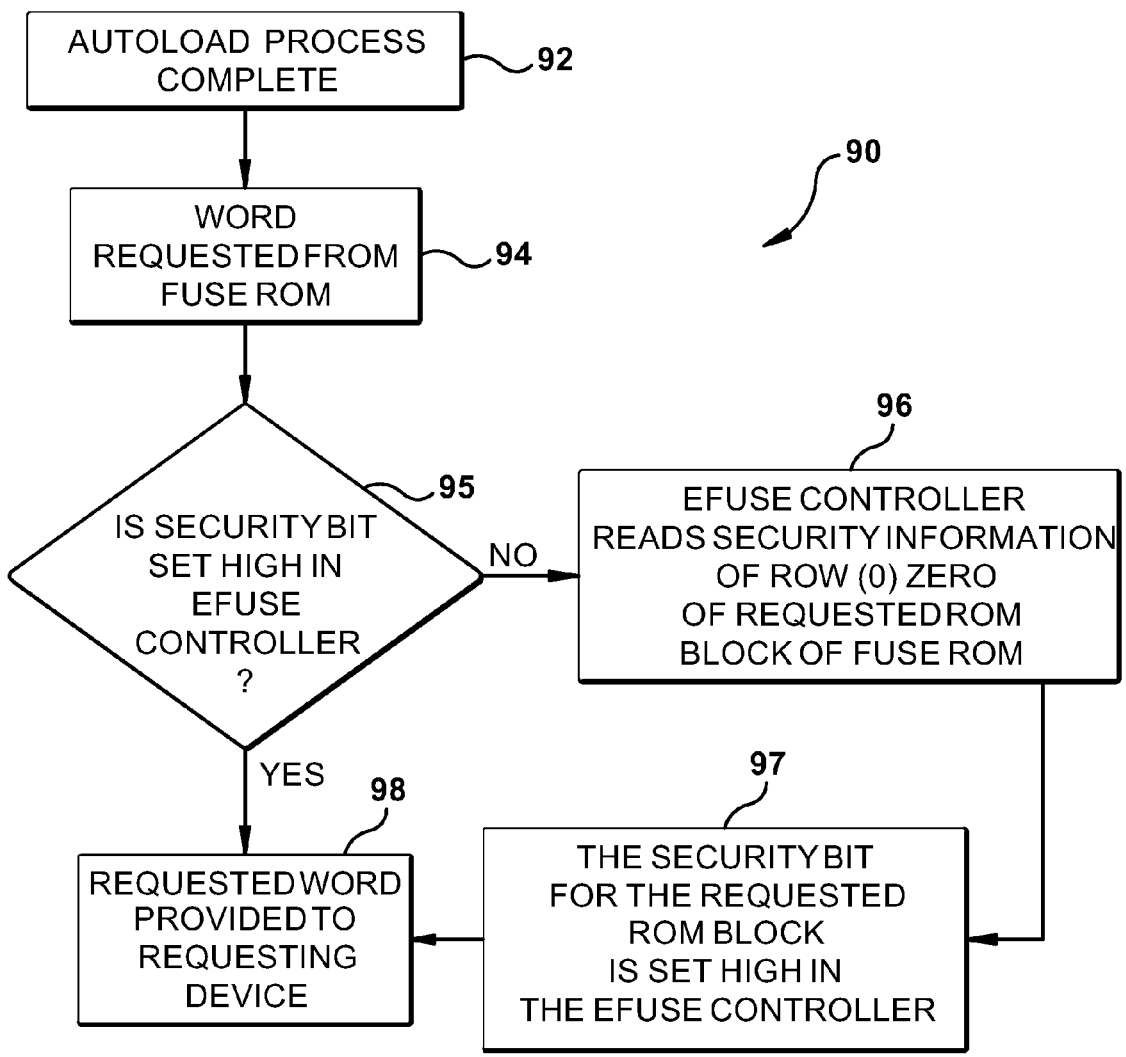
FIG. 5 illustrates an example of a security read process in accordance with another aspect of the invention.

This above operation is further illustrated in the security bit set process 90 of FIG. 5. At 92, the autoload process of FIG. 3 has been completed. At 94, a request is made by a device for at least one word from the fuse ROM, such as a memory device or one or more remote devices. At 95, a determination is made as to whether the security bit for the requested ROM block is set high. If the determination 95 is in the affirmative, the requested word or words are provided to the requesting device at 98. If the determination 95 is in the negative, the efuse controller reads the security information at 96 for row (0) zero of requested ROM block of fuse ROM. At 97, the efuse controller sets the security bit for the requested ROM block high. The requested word or words are then provided to the requesting device at 98.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. An electronic fuse system comprising:
   a fuse read only memory (ROM) having one or more blocks of memory, each block of memory having a plurality of words with at least one word of the plurality of words containing security bits associated with a respective block;
   an electronic fuse controller in communication with the fuse ROM and one or more external devices that are configured to request one or more words that reside in the fuse ROM from the electronic fuse controller; and
   at least one security register that includes indication bits that provide an indication whether security bits have been obtained for a respective block of memory of the fuse ROM after a power down and power up cycle, wherein the electronic fuse controller, in response to a request to read a word from a block of memory from an external device, provides the requested word if an indication bit associated with the block of memory is set or reads the at least one word of the plurality of words containing security bits associated with the block of memory if the indication bit associated with the block of memory is not set, sets the indication bit associated with the block of memory, and provides the requested word.

2. The electronic fuse system of claim 1, wherein the electronic fuse system resides in an integrated circuit.

3. The electronic fuse system of claim 1, wherein the at least one security register resides in the electronic fuse controller.

4. The electronic fuse system of claim 1, wherein all security bits are initialized in the at least one security register upon power cycling the electronic fuse controller.

5. The electronic fuse system of claim 2, wherein all security bits are initialized in the at least one security register upon power cycling the electronic fuse controller.

6. The electronic fuse system of claim 3, wherein all security bits are initialized in the at least one security register upon power cycling the electronic fuse controller.

7. The electronic fuse system of claim 2, wherein the integrated circuit is coupled to a wireless personal electronic device.

8. The electronic fuse system of claim 7, wherein the wireless personal electronic device is a cell phone.

9. The electronic fuse system of claim 8, wherein all security bits are initialized in the at least one security register upon power cycling the electronic fuse controller.

10. A method of transferring secured data from electronic fuse system comprising:
    providing a fuse read only memory (ROM) having one or more blocks of memory, each block of memory having a plurality of words with at least one word of the plurality of words containing security bits associated with a respective block;
    communicating an electronic fuse controller with the fuse ROM and one or more external devices that are configured to request one or more words that reside in the fuse ROM from the electronic fuse controller; and
    evaluating at least one security register that includes indication bits that provide an indication whether security bits have been obtained for a respective block of memory of the fuse ROM after a power down and power up cycle, wherein the electronic fuse controller, in response to a request to read a word from a block of memory from an external device, provides the requested word if during the evaluation an indication bit associated with the block of memory is set or reads the at least one word of the plurality of words containing security bits associated with the block of memory if the indication bit associated with the block of memory is not set, sets the indication bit associated with the block of memory, and provides the requested word.

11. The method of claim 10 further comprising the step of initializing all security bits in the at least one security register upon power cycling the electronic fuse controller.

12. The method of claim 10, wherein the at least one security register resides in the electronic fuse controller.

13. The method of claim 12 further comprising the step of initializing all security bits in the at least one security register upon power cycling the electronic fuse controller.

14. The method of claim 12, wherein the integrated circuit is coupled to a wireless personal electronic device.

15. The method of claim 14 further comprising the step of initializing all security bits in the at least one security register upon power cycling the electronic fuse controller.

16. An integrated circuit containing an electronic fuse system comprising:
    a fuse read only memory (ROM) having one or more blocks of memory, each block of memory having a plurality of words with at least one word of the plurality of words containing security bits associated with a respective block;
    an electronic fuse controller in communication with the fuse ROM and one or more external devices that are configured to request one or more words that reside in the fuse ROM from the electronic fuse controller; and
    at least one security register that includes indication bits that provide an indication whether security bits have been obtained for a respective block of memory of the fuse ROM after a power down and power up cycle, wherein the electronic fuse controller, in response to a request to read a word from a block of memory from an external device, provides the requested word if an indication bit associated with the block of memory is set or reads the at least one word of the plurality of words containing security bits associated with the block of memory if the indication bit associated with the block of memory is not set, sets the indication bit associated with the block of memory, and provides the requested word.

17. The integrated circuit of claim 16, wherein the at least one security register resides in the electronic fuse controller.

18. The integrated circuit of claim 16, wherein the integrated circuit is coupled to a wireless personal electronic device.

19. The integrated circuit of claim 18, wherein the wireless personal electronic device is a cell phone.

20. The integrated circuit of claim 16, wherein all security bits are initialized in the at least one security register upon power cycling the electronic fuse controller.

* * * * *